United States Patent [19]

Reddy

[11] Patent Number: 4,629,859
[45] Date of Patent: Dec. 16, 1986

[54] ENHANCED EVAPORATION FROM A LASER-HEATED TARGET

[75] Inventor: K. Virupaksha Reddy, Naperville, Ill.

[73] Assignee: Standard Oil Company (Indiana), Chicago, Ill.

[21] Appl. No.: 722,808

[22] Filed: Apr. 12, 1985

[51] Int. Cl.⁴ .............................................. B23K 26/00
[52] U.S. Cl. ...................... 219/121 LM; 219/121 LJ; 219/121 LN; 219/121 LZ; 427/53.1
[58] Field of Search .... 219/121 L, 121 LM, 121 LG, 219/121 LN, 121 LH, 121 LJ, 121 LR, 121 LZ; 427/53.1

[56] References Cited

U.S. PATENT DOCUMENTS

| 4,324,854 | 4/1982 | Beauchamp et al. | 427/53.1 X |
| 4,529,617 | 7/1985 | Chenevas-Paule et al. | 219/121 LX |
| 4,543,133 | 9/1985 | Mukai | 427/53.1 X |

Primary Examiner—C. L. Albritton
Attorney, Agent, or Firm—Richard A. Kretchmer; William T. McClain; William H. Magidson

[57] ABSTRACT

The rate of evaporation of material from a laser-heated target is enhanced by coating the target with a layer of condensed substantially inert gas.

20 Claims, 3 Drawing Figures

ENHANCED EVAPORATION FROM A LASER-HEATED TARGET

BACKGROUND OF THE INVENTION

1. Field of the Invention

This invention relates to a method for enhancing the rate of evaporation of material from a laser-heated target. More particularly, it relates to the use of a target which is coated with a layer of condensed substantially inert gas.

2. Description of the Prior Art

The preparation of high quality thin films from a variety of materials has become of substantial importance in a variety of technologies. For example, semiconductor films deposited on various substrates are utilized in the fabrication of diodes, photovoltaic cells, transistors, and other electronic devices. Similarly, thin films of various insulators and conductors are also utilized in the manufacture of electronic devices and solar cells. For example, metal-insulator-semiconductor solar cells comprise three layers, wherein the top layer is a transparent conducting metal film, the intermediate layer is a very thin layer of an insulating material such as silicon dioxide, and the bottom layer is a semiconductor such as silicon.

A large number of techniques have been developed for the deposition of thin films on a variety of substrates. Included in the various techniques which are currently available for the preparation of films are thermal evaporation from resistance, electron-beam, rf- or laser-heated sources, molecular beam epitaxy, ion implantation, plasma spraying, glow discharge sputter deposition, ion beam deposition, and chemical vapor deposition. Many of the more important methods of film deposition are summarized in "Thin Film Processes," J. L. Vossen and W. Kern, Ed., Academic Press, New York, N.Y., 1978.

The preparation of films by evaporation from a laser-heated source offers several advantages over many of the alternative methods. For example, the laser beam can be controlled in such a manner that only the source material is heated. Accordingly, this technique has the advantage of being extremely clean and does not ordinarily result in the incorporation of unwanted impurities into the resulting film. In contrast, thermal evaporation from resistance or rf-heated sources typically involves the use of a heated crucible to contain the source material and, as a consequence, there is frequently an undesired migration of impurities into the source material and film from the crucible. Laser evaporation is also a desirable method for the preparation of films because, at high power densities, laser heating typically results in congruent evaporation of source material components. Accordingly, the composition of the resulting film is usually substantially identical to that of the source material.

The laser evaporation technique has been used to produce films from a variety of materials. For example, the formation of mercury cadmium telluride ($Hg_{1-x}Cd_xTe$) films using a Nd:yttrium aluminum garnet (Nd:YAG) laser has been described by J. T. Cheung et al., *J. Vac. Sci. Technol.*, Vol. 21, No. 1, 1982, pp. 182–186. Similarly, M. Hanabusa et al., *Appl. Phys. Lett.*, Vol. 39, No. 5, 1981, pp. 431–432, have described the formation of hydrogenated amorphous silicon films using a Nd:YAG laser at wavelengths of 1.06 μm and 532 nm. Formation of thin films of $SnO_2$ using a Nd:YAG laser operated at 1.06 μm has also been reported by H. T. Yang et al., *J. Crystal Growth*, Vol. 56, 1982, pp. 429–432.

Unstable noble gas halides, such as XeF, XeCl, XeBr, KrF and ArF have found use as light emitting species in lasers since they can be easily formed in excited states by electron-beam pumping or discharge pumping of suitable gas mixtures. Such lasers, which are referred to as "excimer lasers", operate in the ultraviolet region of the spectrum. Accordingly, they represent a source of relatively high energy photons. For example, a mixture of 10% xenon, 89% argon and 1% fluorine can be pumped with 400 keV electrons to produce excited XeF which emits light of 351 nm wavelength. Similarly, ArF, KrF and XeCl can be utilized to generate light of 193 nm, 248 nm and 308 nm wavelength, respectively.

Amorphous silicon films can be obtained by the condensation of silicon vapor on a substrate whose temperature is considerably below the melting point of silicon. Such methods include thermal evaporation, cathode sputtering, and plasma deposition by decomposition of silane ($SiH_4$) in a glow discharge. If desired, films of amorphous silicon can be converted to crystalline silicon by annealing.

Amorphous silicon films for semiconductor use are typically prepared in a manner which results in the incorporation of up to about 30 atom percent hydrogen. Accordingly, the resulting material is often referred to as a "hydrogenated amorphous silicon" or an "amorphous silicon-hydrogen alloy". The hydrogen results in valency saturation within the amorphous silicon, which is of importance for satisfactory electric and photoelectric properties because free valencies can capture the charge carriers (electrons or holes) within the material. For example, this effect of free valencies serves to reduce the lifetime of the charge carriers and, hence, the photoconductivity of the material.

For various applications, such as the manufacture of photovoltaic cells, the electrical conductivity of silicon can be modified by doping with small quantities of impurity atoms. Most commonly, boron or phosphorus atoms have been utilized as dopants. In the case of phosphorus, a pentavalent phosphorus atom is substituted for a silicon atom in tetrahedral surroundings, and four electrons of the phosphorus atom are utilized for bonding with neighboring silicon atoms. The fifth valence electron of phosphorus is only loosely bonded and can be released as a conduction electron. In the case of boron, a trivalent boron atom is similarly substituted for a silicon atom, and accepts a total of five electrons from neighboring silicon atoms to create an electron vacancy which behaves like a positive charge and contributes to the current-carrying capability as a positive hole.

SUMMARY OF THE INVENTION

The present invention is directed to the discovery that the rate of evaporation of material from a laser-heated target can be increased by coating the target with a thin layer of condensed substantially inert gas.

One embodiment of the invention is a method for evaporating material from a target which comprises the steps of: (a) cooling a target and condensing a layer of substantially inert gas on said cooled target to produce a coated target; and (b) irradiating said coated target with coherent light of a wavelength which is absorbed by the target, wherein the intensity of said light is effective to evaporate material from said target.

Another embodiment of the invention is a method for depositing a film on a substrate which comprises the steps of: (a) cooling a target and condensing a layer of substantially inert gas on said cooled target to produce a coated target, wherein said target is comprised of a solid and said gas is selected from the group consisting of neon, argon, krypton, xenon and nitrogen; (b) irradiating said coated target with coherent light of a wavelength which is absorbed by the target, wherein the intensity of said light is effective to evaporate material from said target; and (c) condensing at least a portion of said evaporated target material as a film on a substrate.

A further embodiment of the invention is a method for depositing a silicon film on a substrate which comprises the steps of: (a) cooling a target and condensing a thin layer of substantially inert gas on said cooled target to produce a coated target, wherein said target is comprised of silicon and said gas is selected from the group consisting of neon, argon, krypton, xenon and nitrogen; (b) irradiating said coated target with coherent light of a wavelength in the range from about 190 to about 1000 nm, wherein the intensity of said light is effective to evaporate material from said target; and (c) condensing at least a portion of said evaporated target material as a film on a substrate.

An object of this invention is to provide a method for enhancing the evaporation rate of a laser-heated material.

Another object of this invention is to provide a method for the enhanced evaporation of material from a laser-heated target which does not require an increase in laser power.

Another object of this invention is to provide an improved method for the formation of thin films from a laser-heated source.

A further object of this invention is to increase the rate of film production from a laser-heated source.

A further object of this invention is to provide an improved method for the preparation of silicon films from a laser-heated silicon source.

A still further object of this invention is to provide an improved method for cutting, etching or engraving a target material with a laser.

DETAILED DESCRIPTION OF THE INVENTION

Figure 1:
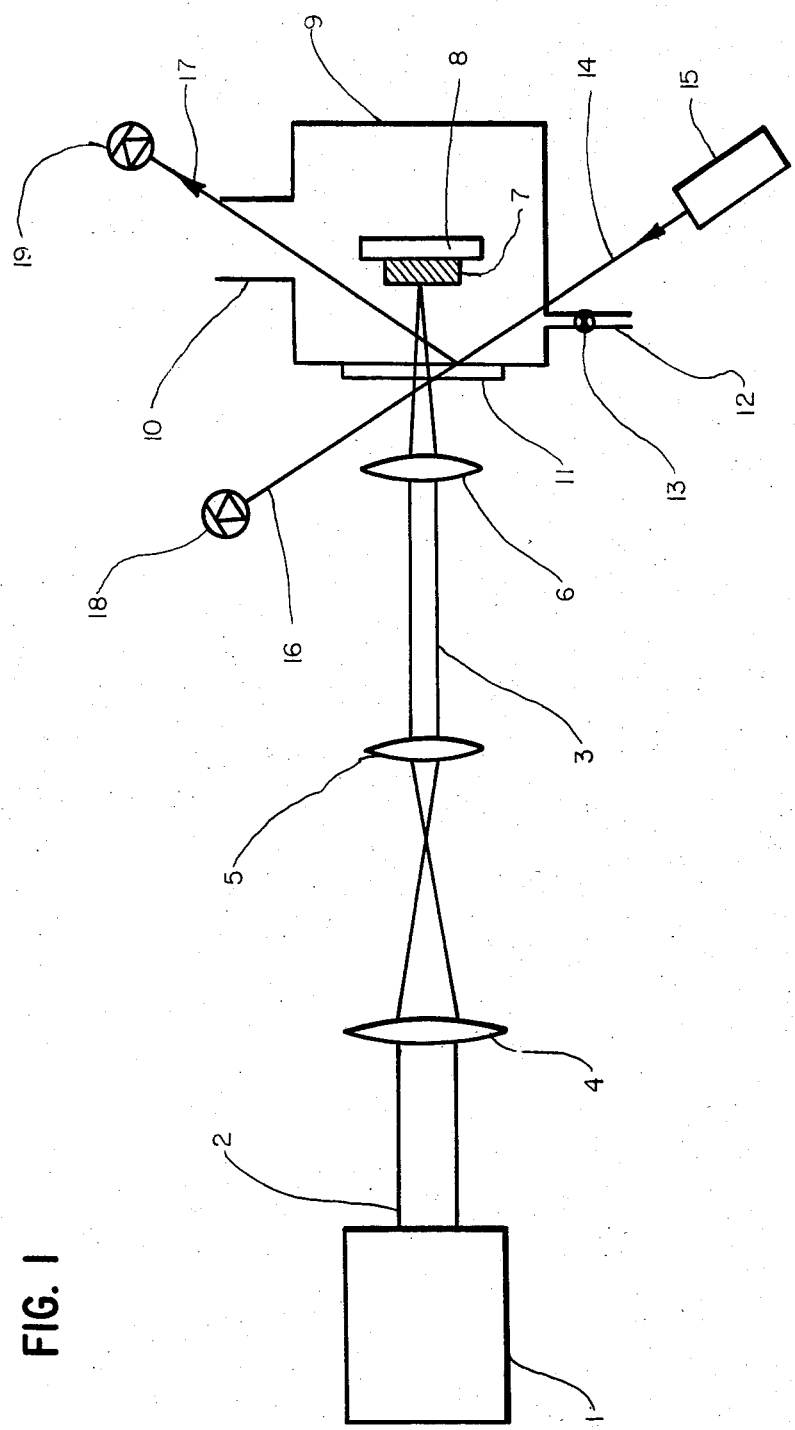
FIG. 1 of the drawings is a schematic representation of the apparatus which was utilized to evaluate the method of this invention.

The use of a beam of coherent light from a laser to engrave, etch, cut, heat or evaporate a target material is a well-known process. I have found that this process can be substantially improved by coating the target with a layer of condensed gas which is substantially inert. More specifically, this coating results in a more efficient transfer of energy from the laser beam to the target material. Although the invention is not to be so limited, it is believed that the layer of condensed gas on the target functions as an antireflective coating which reduces the amount of light reflected from the target and, accordingly, increases the amount of energy absorbed from the laser beam by the target.

Gases for use in coating the target material in the practice of this invention must be substantially inert and should also be substantially transparent to light of the wavelength produced by the laser. Suitable gases for this purpose include, but are not limited to, neon, argon, krypton, xenon and nitrogen. If desired, the substantially inert gas coating can contain minor amounts of other condensed gases which are capable of reacting with or doping the target material which is evaporated by the laser beam. For example, in the case of a silicon target, such other gases include, but are not limited to, $H_2$, $B_2H_6$, $C_2H_4$ and $PH_3$. This, of course, provides a method for producing a doped silicon film by deposition of the resulting vapor on a substrate.

In the practice of this invention, the target material is cooled to a temperature which is sufficiently low to permit condensation of the substantially inert gas which is used as a coating. Preferably, the target is cooled to a temperature which is below the boiling point of the substantially inert gas which is employed. More preferably, the target is cooled to a temperature which is below the melting point of the substantially inert gas which is used as a coating. It will be appreciated, of course, that the layer of condensed gas on the target can be in either the liquid or the solid state.

The thickness of the layer of substantially inert gas on the target can vary over a wide range. However, a thickness in the range from about 10 to about 10,000 nm is preferred.

The coherent light employed in the practice of this invention can be of any wavelength which is absorbed by the target. Desirably, however, the wavelength is in the range from about 190 to about 1000 nm, and preferably from about 190 to about 360 nm. The shorter wavelengths are generally preferred because the light is of higher energy and, accordingly, more efficient for use in heating or evaporating a target material. The source of the light is not critical, and any conventional laser can be used, provided that the light produced by it is of sufficient intensity (provides a sufficient concentration of photons) to evaporate material from the target. For example, a laser producing pulsed radiation which is characterized by a pulse repetition rate in the range from about 1 Hz to about 80 MHz and a pulse energy in the range from about 5 to about 1000 mJ/pulse is satisfactory for the practice of this invention. An excimer laser based on KrF and operating at a wavelength of 248 nm is particularly suitable.

A highly preferred embodiment of the invention involves the use of pulsed coherent light. Such pulsed irradiation of the target material results in very high surface temperatures and short thermal cycles. Although the invention is not to be so limited, it is believed that the coating of substantially inert gas on the target is evaporated together with some of the target material when irradiated with the intense beam of coherent light. If a continuous source of light is employed, the beneficial effect of the coating of condensed gas on the target is only obtained initially. However, if a pulsed source of light is employed, gas is able to recondense on the target between pulses to reform a coating. Accordingly, the beneficial effect of the coating is obtained with each pulse of light.

The target material can comprise any solid material which has the ability to absorb light of the wavelength which is employed. If it is desired to prepare a film by condensation of evaporated target material, it will frequently be desirable to utilize a target material which can be evaporated and condensed without substantial chemical decomposition. However, for most cutting, engraving and etching operations, this will not be an important consideration. In addition, it will be appreciated that there are situations when it will be desirable for the evaporated target material to undergo chemical modification either prior to deposition or concurrent with deposition on a substrate.

As used herein, it will be understood that the evaporation of a target material encompasses both: (a) the evaporation of target material without chemical change, and (b) the evaporation of target material with associated chemical change or decomposition. For example, cutting or etching a polymeric organic target with a laser beam will typically result in the formation of a vapor which is chemically dissimilar from the target as a consequence of chemical decomposition. On the other hand, materials such as silicon and copper can be evaporated by a laser beam without chemical change.

When pulsed coherent light is utilized in the practice of this invention, it is preferred to use a target material which has a thermal conductivity which is greater than about $1.00 \text{ W cm}^{-1} \text{ K}^{-1}$ at 25° C. Such a material permits a relatively rapid conduction of heat away from the target surface. Accordingly, the target surface cools very rapidly after each pulse of light and permits a relatively efficient recondensation of evaporated, substantially inert gas on the target surface prior to the next pulse of light.

The process of this invention can be carried out at ambient pressures or at pressures which are either above or below ambient pressure. However, a preferred embodiment of the invention involves the preparation of films by the evaporation and condensation of target material at a pressure of about $10^{-3}$ torr or lower, and preferably at about $10^{-5}$ torr. It will be appreciated, of course, that operation at these relatively low pressures permits a more satisfactory transport of vaporized material from the target to a suitable substrate where the film is formed. In addition, a relatively low pressure serves to minimize the occlusion of gas molecules in the film as it forms.

In those situations wherein a film is desired which has the same chemical composition as the source material and is to be produced by congruent evaporation and congruent condensation, the process of this invention is preferably carried out in an atmosphere which is substantially free of gases other than the substantially inert gas which is utilized to coat the target. However, by variation of the atmosphere under which the film is formed, it is possible to produce doped films or films which have a chemical composition which is not the same as that of the target material. For example, hydrogenated amorphous silicon films can be prepared by evaporating a silicon target and condensing the evaporated target material in a hydrogen atmosphere. Similarly, a doped silicon film can be prepared by evaporating a silicon target and condensing the evaporated target material in an atmosphere which will contribute a suitable dopant material. For example, doped silicon films can be prepared by conducting the evaporation and condensation in an atmosphere which comprises a material selected from the group consisting of $B_2H_6$ and $PH_3$.

Doped films can also be formed by the process of this invention through the evaporation and condensation of a doped target material. For example, doped films of amorphous silicon can be formed through the use of a doped silicon target material. Typically, the doped silicon target will be comprised of a major proportion of silicon and a minor amount of the dopant material. Suitable dopants for silicon include, but are not limited to, hydrogen, carbon, boron and phosphorus.

Film formation in accordance with this invention involves condensing evaporated target material on a substrate. The precise nature of this substrate is not critical. Indeed, the type of substrate will ordinarily be dictated by the intended use of the film or by considerations of convenience and availability. However, it will be appreciated that the substrate should be relatively inert with respect to the film which is formed on it.

The following examples are intended only to illustrate the invention and are not to be construed as imposing limitations on it.

EXAMPLE I

FIG. 1 is a schematic representation of the apparatus which was utilized to illustrate the method of this invention. A KrF excimer laser 1 operating at a wavelength of 248 nm (Lambda-Physik model 210E) was utilized to produce a coherent beam of light 2 which had a rectangular cross section of 10 mm by 30 mm. The light beam 2 was shaped to a beam 3 having a rectangular cross section of 5 mm by 15 mm using two $CaF_2$ lenses 4 and 5 in a telescopic configuration. The beam of light 3 was then focused on target 7 using a 10 cm focal length $CaF_2$ lens 6. Target 7 was mounted in the sample holder 8 of cryogenic vacuum chamber 9 (Air Products model CS-202E) and the chamber evacuated through exit line 10 using, in combination, a venturi pump, a sorption pump and an ion pump. A fused quartz window 11 having a diameter of 44 mm and a thickness of 3 mm was used to admit the focused laser beam into vacuum chamber 9. Target 7 was positioned at a distance of 2.5 cm from window 11. Inert gas for coating target 7 was charged to vacuum chamber 9 and sprayed onto target 7 through line 12 controlled by valve 13.

The growth of the film produced by condensation of evaporated target material on the interior surface of window 11 was continuously monitored using a spatially resolved optical interference technique. More specifically, a beam of light 14 from He-Ne laser 15 was directed onto window 11, and the intensity of transmitted beam 16 and reflected beam 17 measured by means of photodiodes 18 and 19, respectively. When the film's optical thickness is an even integer multiple of $\lambda/4$, where $\lambda$ is the He-Ne laser wavelength of 6328 Angstrom units, constructive interferences occur in transmitted beam 16, and destructive interferences occur in beam 16 when the film thickness is an odd integer multiple of $\lambda/4$. Maxima and minima in reflected beam 17 correspond to minima and maxima, respectively, in transmitted beam 16. Accordingly, the film thickness L can be determined using the following equation:

$$L = k\lambda/2n(\cos\theta)$$

where k is the integer interference order number, $\lambda$ is the He-Ne laser wavelength, n is the index of refraction of the film, and $\theta$ is the angle of incidence of laser beam 14.

A silicon wafer, which had been cleaned with hydrogen fluoride gas, was mounted on sample holder 8 as target 7, and vacuum chamber 9 was evacuated to a pressure of $4\times10^{-6}$ torr. The silicon target was then further cleaned by rastering with the excimer laser 1, and the resulting target cooled to about $-240°$ C. over a period of about 40 minutes. A film of argon was deposited on the cooled silicon target by spraying about 400 to 1000 torr cm$^3$ of argon gas onto it. The resulting argon coated silicon target was irradiated at a wavelength of 248 nm with a pulsed laser beam, having a pulse energy of 195 mJ and a repetition rate of 5 Hz, which was focused to a spot size on the target of 0.6 mm by 0.83 mm. The thickness growth rate of the silicon film formed on window 11 was found to be 1.22 Angstrom units per laser pulse or 2.2 microns per hour.

EXAMPLE II

Figure 2:
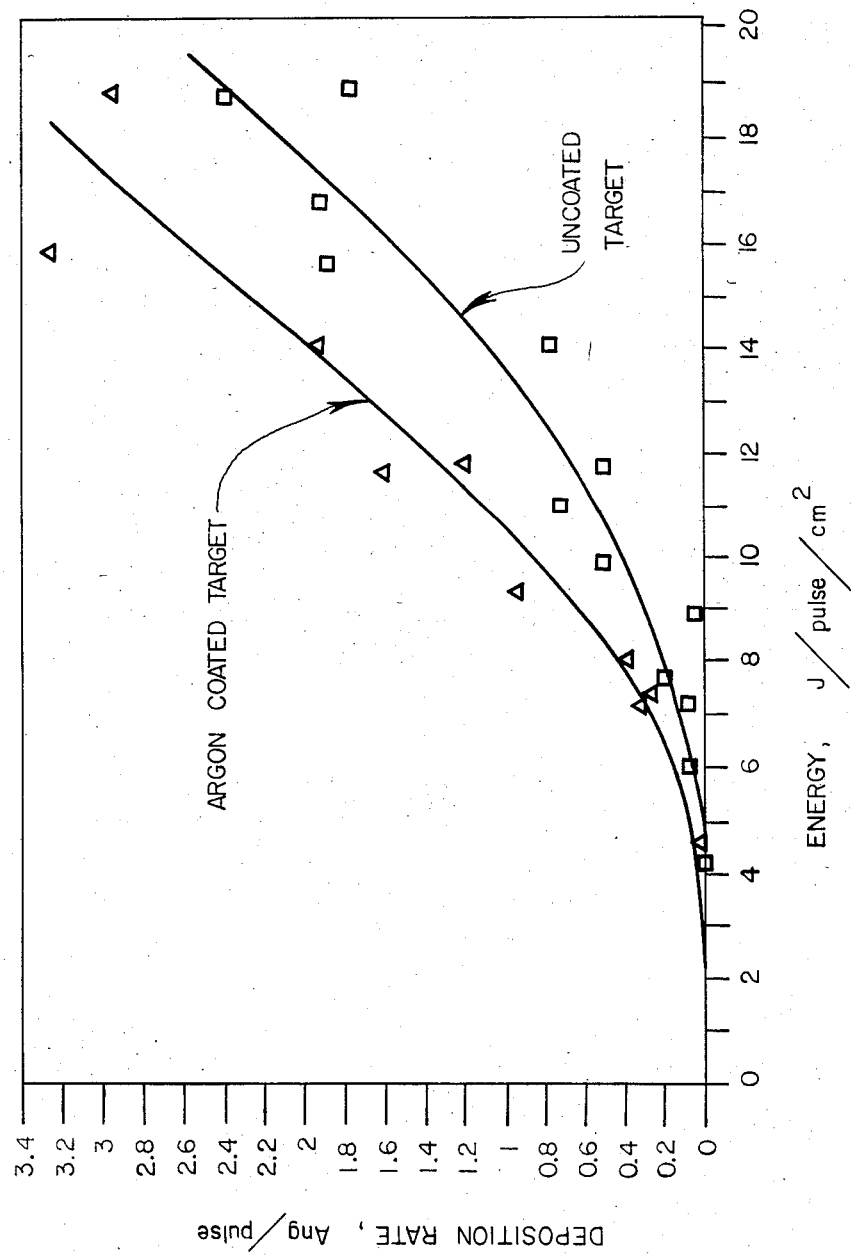
FIG. 2 of the drawings compares the rate of silicon film formation as a function of KrF excimer laser pulse energy for an argon-coated silicon target and an uncoated silicon target.

A series of experiments were carried out substantially as described in Example I except that the laser pulse energy was varied over the range from about 4 to about 19 J/cm$^2$. In addition, a series of control experiments were carried out over this range of pulse energies involving the use of a target at ambient temperature which was not coated with argon. The results are set forth in FIG. 2. These results demonstrate that an argon coating on the silicon target serves to increase the rate of silicon film deposition by a factor of about 2 or 3 over a wide range of pulse energies.

EXAMPLE III

A silicon film was prepared in substantially the same manner as described in Example I except that the film was collected on a sodium chloride window (3.2 cm diameter and 0.32 cm thick) which was attached to the interior surface of fused quartz window 11 and the laser pulse energy was 100 mJ/pulse with a repetition rate of 2 Hz. After a total of 23,000 laser pulses, the resulting silicon film had a thickness of several microns. The film was separated from the sodium chloride window by placing a few drops of water on the uncoated regions of the sodium chloride window. After a few minutes, the water penetrated the Si/NaCl interface and the silicon film floated free on the surface of the water. Samples from various areas of the film were then subjected to analysis by transmission electron microscopy. These analyses demonstrated that single crystal silicon was present in regions near the edge of the film and that the region near the center of the film was composed of amorphous silicon.

EXAMPLE IV

Figure 3:
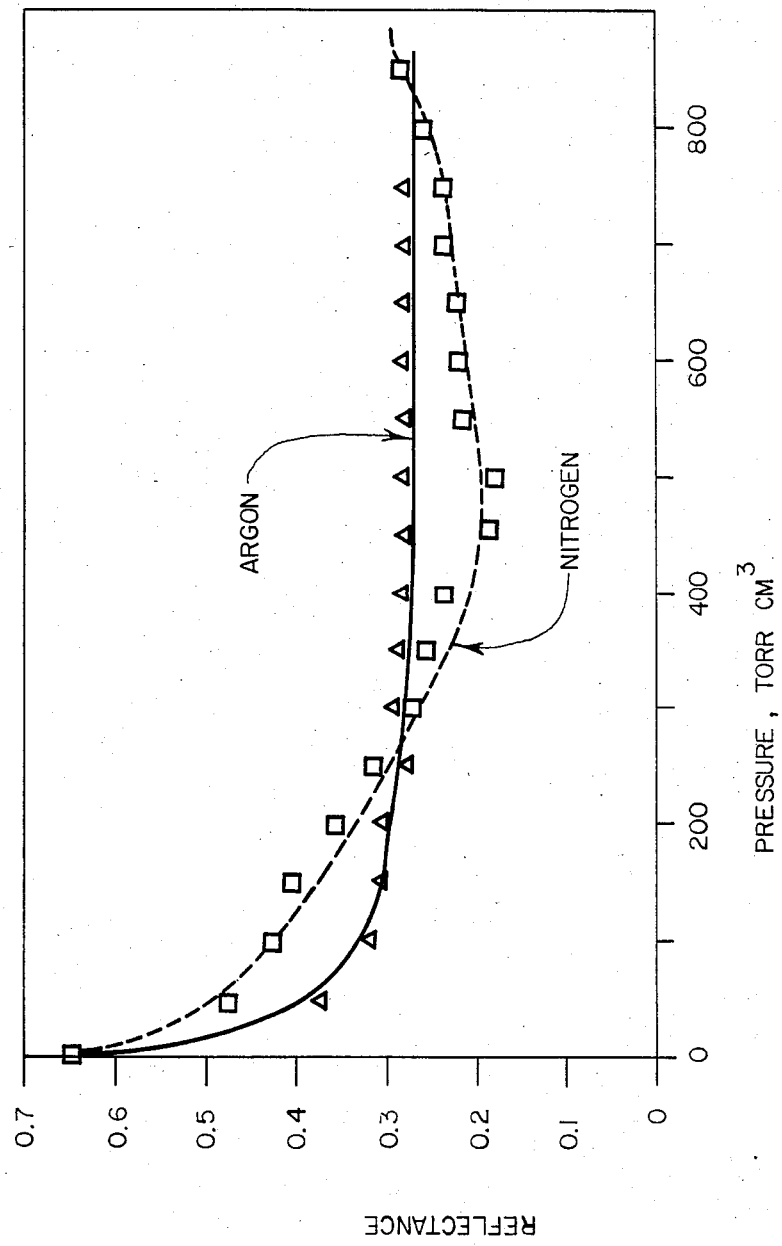
FIG. 3 of the drawings illustrates the ability of a coating of argon or nitrogen to change the reflectance of silicon.

A silicon target was cooled to a temperature of about $-248°$ C. and a low intensity KrF excimer laser beam having a pulse energy of 0.02 J/cm$^2$ was reflected off the target at an angle of incidence of about 5°. The energy of the reflected beam (the reflectance) was then measured as a function of the amount of inert gas sprayed on the target to coat it. Both nitrogen and argon were utilized as the inert gas, and the results are set forth in FIG. 3. These results demonstrate that a nitrogen or argon coating can reduce the reflectance of the silicon target by as much as a factor of 3.6 or 2.4, respectively. The results also indicate that the gas coatings have the ability to increase the amount of laser energy absorbed by the target and thereby increase the target evaporation rate in accordance with the subject invention.

EXAMPLE V

Example I was repeated except that a gallium arsenide (GaAs) target was employed which has a lower thermal conductivity than silicon, the laser was operated at 210 mJ/pulse with a repetition rate of 1 Hz, and the laser beam was focused to a spot size on the target of 1.3 mm by 2.6 mm. The temperature of the gallium arsenide target was found to increase rapidly and reached $-153°$ C. after only about four laser pulses. The film deposition rate was 1.45 Angstrom units per laser pulse. Because of the low thermal conductivity of gallium arsenide and the resulting rapid increase in target temperature, it is believed that the argon coating could not reform between laser pulses. Accordingly, with gallium arsenide it is believed that the benefit of the argon coating is observed only initially.

EXAMPLE VI

A gallium arsenide film was prepared as described in Example V except that the target was not coated with argon, the target had an initial temperature of 23° C., and the laser pulse energy was 190 mJ/pulse with a repetition rate of 1 Hz. The film deposition rate was 1.32 Angstrom units per pulse, and the temperature of the target increased to about 33° C. after 2000 pulses. The film formation rate is about the same as that observed in Example V where the target was coated with an argon film.

EXAMPLE VII

Example I was repeated except that a copper target was employed and the laser pulse energy was 110 mJ/pulse with a 5 Hz repetition rate. The temperature of the target increased from an initial value of $-248°$ C. to $-246°$ C. after 50 laser pulses, to $-242°$ C. after 2200 laser pulses. This experiment was then duplicated except that the target was not coated with argon. The copper film deposition rate onto window 11 was found to be increased by a factor of four by coating the target with argon.

I claim:

1. A method for evaporating material from a target which comprises the steps of:
   (a) cooling a target and condensing a layer of substantially inert gas on said cooled target to produce a coated target; and
   (b) irradiating said coated target with coherent light of a wavelength which is absorbed by the target, wherein the intensity of said light is effective to evaporate material from said target.

2. The method as set forth in claim 1 wherein said coherent light is pulsed.

3. The method as set forth in claim 2 wherein said target is comprised of a material having a thermal conductivity which is greater than about 1.00 W cm$^{-1}$ K$^{-1}$ at 25° C.

4. The method as set forth in claim 3 wherein said gas is selected from the group consisting of neon, argon, krypton, xenon and nitrogen.

5. A method for depositing a film on a substrate which comprises the steps of:
   (a) cooling a target and condensing a layer of substantially inert gas on said cooled target to produce a coated target, wherein said target is comprised of a solid and said gas is selected from the group consisting of neon, argon, krypton, xenon and nitrogen;

(b) irradiating said coated target with coherent light of a wavelength which is absorbed by the target, wherein the intensity of said light is effective to evaporate material from said target; and (c) condensing at least a portion of said evaporated target material as a film on a substrate.

6. The method as set forth in claim 5 wherein said coherent light is pulsed.

7. The method as set forth in claim 6 wherein said target is comprised of a material having a thermal conductivity which is greater than about 1.00 W cm$^{-1}$ K$^{-1}$ at 25° C.

8. The method as set forth in claim 7 wherein said target is comprised of a material which can be evaporated and condensed without substantial chemical decomposition.

9. The method as set forth in claim 8 wherein steps (b) and (c) are carried out at a pressure of about 10$^{-3}$ torr or lower.

10. The method as set forth in claim 9 wherein said layer of condensed gas has a thickness in the range from about 10 to about 10,000 nm.

11. A method for depositing a silicon film on a substrate which comprises the steps of:

(a) cooling a target and condensing a thin layer of substantially inert gas on said cooled target to produce a coated target, wherein said target is comprised of silicon and said gas is selected from the group consisting of neon, argon, krypton, xenon and nitrogen;

(b) irradiating said coated target with coherent light of a wavelength in the range from about 190 to about 1000 nm, wherein the intensity of said light is effective to evaporate material from said target; and (c) condensing at least a portion of said evaporated target material as a film on a substrate.

12. The method as set forth in claim 11 wherein said target is cooled below the melting point of said gas.

13. The method as set forth in claim 12 wherein said layer of condensed gas has a thickness in the range from about 10 to about 10,000 nm.

14. The method as set forth in claim 12 wherein said coherent light is pulsed.

15. The method as set forth in claim 14 wherein the pulse repetition rate is from about 1 Hz to about 80 MHz.

16. The method as set forth in claim 14 wherein steps (b) and (c) are carried out at a pressure of about 10$^{-3}$ torr or lower.

17. The method as set forth in claim 16 wherein said target is comprised of a major proportion of silicon and a minor proportion of a dopant.

18. The method as set forth in claim 17 wherein said dopant comprises at least one material selected from the group consisting of hydrogen, carbon, boron and phosphorus.

19. The method as set forth in claim 16 which is carried out in an atmosphere which is substantially free of gases other than said substantially inert gas.

20. The method as set forth in claim 16 which is carried out in an atmosphere which comprises hydrogen.

* * * * *